(12) United States Patent
Brazzle et al.

(10) Patent No.: US 11,844,178 B2
(45) Date of Patent: Dec. 12, 2023

(54) ELECTRONIC COMPONENT

(71) Applicant: ANALOG DEVICES INTERNATIONAL UNLIMITED COMPANY, County Limerick (IE)

(72) Inventors: John David Brazzle, Tracy, CA (US); Sok Mun Chew, Pulau Pinang (MY)

(73) Assignee: Analog Devices International Unlimited Company, County Limerick (IE)

( * ) Notice: Subject to any disclaimer, the term of this patent is extended or adjusted under 35 U.S.C. 154(b) by 0 days.

(21) Appl. No.: 17/325,080

(22) Filed: May 19, 2021

(65) Prior Publication Data

US 2021/0378098 A1 Dec. 2, 2021

Related U.S. Application Data

(60) Provisional application No. 63/033,665, filed on Jun. 2, 2020.

(51) Int. Cl.
*H05K 1/18* (2006.01)
*H01F 27/29* (2006.01)
(Continued)

(52) U.S. Cl.
CPC .............. *H05K 1/181* (2013.01); *H01F 27/29* (2013.01); *H01L 23/3121* (2013.01);
(Continued)

(58) Field of Classification Search
CPC ................. H05K 3/306; H05K 3/3447; H05K 2201/10651; H05K 2201/10901;
(Continued)

(56) References Cited

U.S. PATENT DOCUMENTS 4,089,041 A 5/1978 Lockard
4,739,125 A 4/1988 Watanabe et al.
(Continued)

FOREIGN PATENT DOCUMENTS

CN 101495014 7/2009
CN 102088241 6/2011
(Continued)

OTHER PUBLICATIONS

US 10,643,959 B2, 05/2020, Moussaouni et al. (withdrawn)
(Continued)

*Primary Examiner* — Steven T Sawyer
(74) *Attorney, Agent, or Firm* — Knobbe, Martens, Olson & Bear, LLP

(57) ABSTRACT

An electronic device and a method of forming such an electronic device are disclosed. The electronic device can include an integrated device package and a component. The integrated device package includes a substrate and a package body over the substrate, and a hole formed through the package body to expose a conductive pad of the substrate. The component is mounted over the package body, and includes a component body and a lead extending from the component body through the hole. The lead includes an insulated portion and a distal exposed portion, and the insulated portion includes a conductor and an insulating layer disposed about the conductor, wherein the distal exposed portion is uncovered by the insulating layer such that the conductor is exposed at the distal portion. The electronic device can also include a conductive material that electrically connects the distal exposed portion to the conductive pad of the substrate.

20 Claims, 6 Drawing Sheets

(51) Int. Cl.
  *H01L 23/31* (2006.01)
  *H01L 25/16* (2023.01)
  *H05K 3/34* (2006.01)
  *H01L 23/495* (2006.01)

(52) U.S. Cl.
  CPC ......... *H01L 25/167* (2013.01); *H05K 3/3447* (2013.01); *H01L 23/49575* (2013.01); *H05K 2201/1003* (2013.01); *H05K 2201/10515* (2013.01); *H05K 2201/10901* (2013.01)

(58) Field of Classification Search
  CPC .......... H05K 2201/10318; H05K 2201/10303; H05K 3/3421; H05K 3/3426; H05K 1/181; H05K 2201/1003; H05K 2201/10515; H01F 27/29; H01L 23/3121; H01L 25/167; H01L 23/49575; H01L 23/552; H01L 2224/131; H01L 2224/16227; H01L 2224/16245; H01L 2224/48227; H01L 2224/48247; H01L 2924/19041; H01L 2924/19042; H01L 2924/19043; H01L 2924/19105; H01L 2924/3025; H01L 23/645; H01L 24/10; H01L 25/16; H01L 23/49811; H01L 25/10; H01L 23/14; H01L 23/31; H01L 23/498
  See application file for complete search history.

(56) References Cited

U.S. PATENT DOCUMENTS

| | | | |
|---|---|---|---|
| 4,801,912 A * | 1/1989 | McElheny | H05K 3/3442 336/83 |
| 4,862,246 A | 8/1989 | Masuda et al. | |
| 4,914,259 A | 4/1990 | Kobayashi et al. | |
| 5,343,075 A | 8/1994 | Nishino | |
| 5,485,037 A | 1/1996 | Marrs | |
| 5,514,907 A | 5/1996 | Moshayedi | |
| 5,535,101 A | 7/1996 | Miles et al. | |
| 5,647,124 A | 7/1997 | Chan et al. | |
| 5,706,172 A | 1/1998 | Lee | |
| 5,804,880 A | 9/1998 | Mathew | |
| 5,932,927 A * | 8/1999 | Koizumi | H01L 24/49 257/688 |
| 6,415,504 B1 * | 7/2002 | Matsuda | H05K 3/225 29/850 |
| 6,529,109 B1 * | 3/2003 | Shikama | H01F 27/292 336/200 |
| 6,727,579 B1 | 4/2004 | Eldridge et al. | |
| 7,129,420 B2 | 10/2006 | Hashimoto | |
| 7,683,473 B2 | 3/2010 | Kasai et al. | |
| 7,838,334 B2 | 11/2010 | Yu et al. | |
| 7,939,934 B2 | 5/2011 | Haba et al. | |
| 7,977,773 B1 | 7/2011 | Cusack | |
| 7,982,139 B2 | 7/2011 | Kariya et al. | |
| 8,156,634 B2 | 4/2012 | Gallup et al. | |
| 8,193,034 B2 | 6/2012 | Pagaila et al. | |
| 8,203,164 B2 | 6/2012 | Min et al. | |
| 8,241,956 B2 | 8/2012 | Camacho et al. | |
| 8,258,010 B2 | 9/2012 | Pagaila et al. | |
| 8,283,750 B2 | 10/2012 | Guiraud et al. | |
| 8,349,657 B2 | 1/2013 | Do et al. | |
| 8,349,721 B2 | 1/2013 | Shim et al. | |
| 8,383,457 B2 | 2/2013 | Pagaila et al. | |
| 8,409,922 B2 | 4/2013 | Camacho et al. | |
| 8,445,990 B2 | 5/2013 | Lin et al. | |
| 8,502,387 B2 | 8/2013 | Choi et al. | |
| 8,513,812 B2 | 8/2013 | Lin | |
| 8,525,340 B2 | 9/2013 | Eckhardt et al. | |
| 8,525,344 B2 | 9/2013 | Pagaila et al. | |
| 8,530,274 B2 | 9/2013 | Pagaila | |
| 8,563,418 B2 | 10/2013 | Pagaila et al. | |
| 8,569,882 B2 | 10/2013 | Ko et al. | |
| 8,581,381 B2 | 11/2013 | Zhao et al. | |
| 8,623,702 B2 | 1/2014 | Pagaila | |
| 8,624,374 B2 | 1/2014 | Ding et al. | |
| 8,674,516 B2 | 3/2014 | Han et al. | |
| 8,790,962 B2 | 7/2014 | Pagaila et al. | |
| 8,847,369 B2 | 9/2014 | Yew et al. | |
| 8,853,819 B2 | 10/2014 | Chen et al. | |
| 8,877,567 B2 | 11/2014 | Lee et al. | |
| 8,932,908 B2 | 1/2015 | Lee et al. | |
| 8,941,222 B2 | 1/2015 | Hunt | |
| 8,987,734 B2 | 3/2015 | Wang | |
| 9,006,099 B2 | 4/2015 | Anderson et al. | |
| 9,029,193 B2 | 5/2015 | Marimuthu et al. | |
| 9,054,083 B2 | 6/2015 | Suthiwongsunthorn et al. | |
| 9,059,186 B2 | 6/2015 | Shim et al. | |
| 9,082,780 B2 | 7/2015 | Lin et al. | |
| 9,105,532 B2 | 8/2015 | Choi et al. | |
| 9,117,812 B2 | 8/2015 | Lee et al. | |
| 9,129,980 B2 | 9/2015 | Khan et al. | |
| 9,142,515 B2 | 9/2015 | Pagaila et al. | |
| 9,171,792 B2 | 10/2015 | Sun et al. | |
| 9,177,832 B2 | 11/2015 | Camacho | |
| 9,236,332 B2 | 1/2016 | Pagaila et al. | |
| 9,236,352 B2 | 1/2016 | Pagaila et al. | |
| 9,240,331 B2 | 1/2016 | Kim et al. | |
| 9,245,834 B2 | 1/2016 | Hsieh | |
| 9,257,356 B2 | 2/2016 | Huang et al. | |
| 9,257,411 B2 | 2/2016 | Pagaila et al. | |
| 9,269,595 B2 | 2/2016 | Chi et al. | |
| 9,275,877 B2 | 3/2016 | Lin et al. | |
| 9,281,228 B2 | 3/2016 | Choi et al. | |
| 9,299,650 B1 | 3/2016 | Chi et al. | |
| 9,324,659 B2 | 4/2016 | Cho et al. | |
| 9,331,002 B2 | 5/2016 | Pagaila et al. | |
| 9,337,116 B2 | 5/2016 | Pagaila et al. | |
| 9,343,387 B2 | 5/2016 | Hsu et al. | |
| 9,373,578 B2 | 6/2016 | Choi et al. | |
| 9,378,983 B2 | 6/2016 | Choi et al. | |
| 9,379,064 B2 | 6/2016 | Oh et al. | |
| 9,390,945 B2 | 7/2016 | Lee et al. | |
| 9,391,046 B2 | 7/2016 | Park et al. | |
| 9,397,074 B1 | 7/2016 | Lee et al. | |
| 9,401,347 B2 | 7/2016 | Lee et al. | |
| 9,406,552 B2 | 8/2016 | Chen et al. | |
| 9,406,579 B2 | 8/2016 | Choi et al. | |
| 9,406,636 B2 | 8/2016 | Zhao et al. | |
| 9,406,658 B2 | 8/2016 | Lee et al. | |
| 9,478,486 B2 | 10/2016 | Kim et al. | |
| 9,484,259 B2 | 11/2016 | Lin et al. | |
| 9,502,335 B2 | 11/2016 | Lai et al. | |
| 9,508,626 B2 | 11/2016 | Pagaila et al. | |
| 9,515,009 B2 | 12/2016 | Fen et al. | |
| 9,559,043 B2 * | 1/2017 | Ye | H01L 23/495 |
| 9,570,381 B2 | 2/2017 | Lu et al. | |
| 9,589,910 B2 | 3/2017 | Pagaila et al. | |
| 9,601,369 B2 | 3/2017 | Do et al. | |
| 9,613,912 B2 | 4/2017 | Scanlan | |
| 9,653,407 B2 | 5/2017 | Chen et al. | |
| 9,679,881 B2 | 6/2017 | Pagaila et al. | |
| 9,729,059 B1 | 8/2017 | Parto | |
| 9,754,868 B2 | 9/2017 | Chiang et al. | |
| 9,768,144 B2 | 9/2017 | Wu et al. | |
| 9,799,621 B2 | 10/2017 | Lee et al. | |
| 9,824,923 B2 | 11/2017 | Shariff et al. | |
| 9,824,976 B1 | 11/2017 | Cho | |
| 9,842,808 B2 | 12/2017 | Shin et al. | |
| 9,847,324 B2 | 12/2017 | Lin et al. | |
| 9,922,917 B2 | 3/2018 | Yu et al. | |
| 9,922,955 B2 | 3/2018 | Camacho et al. | |
| 9,966,335 B2 | 5/2018 | Cho et al. | |
| 9,984,993 B2 | 5/2018 | Shu et al. | |
| 9,991,193 B2 | 6/2018 | Essig et al. | |
| 9,997,447 B1 | 6/2018 | Chen et al. | |
| 10,032,652 B2 | 7/2018 | Hsu et al. | |
| 10,096,578 B1 | 10/2018 | Yeh et al. | |
| 10,111,333 B2 | 10/2018 | Yin et al. | |
| 10,115,661 B2 | 10/2018 | Doyle et al. | |
| 10,115,701 B2 | 10/2018 | Zhao et al. | |
| 10,157,821 B1 | 12/2018 | Liu | |

(56) References Cited

U.S. PATENT DOCUMENTS

| | | |
|---|---|---|
| 10,157,887 B2 | 12/2018 | Chen et al. |
| 10,157,890 B2 | 12/2018 | Yu et al. |
| 10,163,867 B2 | 12/2018 | Kim et al. |
| 10,163,876 B2 | 12/2018 | Jeng et al. |
| 10,177,099 B2 | 1/2019 | Gerber et al. |
| 10,186,467 B2 | 1/2019 | Appelt et al. |
| 10,193,442 B2 | 1/2019 | Parto |
| 10,199,320 B2 | 2/2019 | Chiang et al. |
| 10,211,182 B2 | 2/2019 | Meyer et al. |
| 10,224,301 B2 | 3/2019 | Fang et al. |
| 10,229,859 B2 | 3/2019 | Wang |
| 10,229,892 B2 | 3/2019 | Appelt |
| 10,256,173 B2 | 4/2019 | Wu et al. |
| 10,269,771 B2 | 4/2019 | Lyu et al. |
| 10,276,382 B2 | 4/2019 | Hunt et al. |
| 10,297,518 B2 | 5/2019 | Lin et al. |
| 10,297,519 B2 | 5/2019 | Lin |
| 10,319,507 B2 | 6/2019 | Klesyk et al. |
| 10,325,868 B2 | 6/2019 | Tsai |
| 10,332,862 B2 | 6/2019 | Chen et al. |
| 10,361,150 B2 | 7/2019 | Chung et al. |
| 10,381,300 B2 | 8/2019 | Kao et al. |
| 10,388,598 B2 | 8/2019 | Lu et al. |
| 10,403,609 B2 | 9/2019 | Geissler et al. |
| 10,410,970 B1 | 9/2019 | Chiu et al. |
| 10,418,314 B2 | 9/2019 | Lu |
| 10,446,411 B2 | 10/2019 | Chen et al. |
| 10,453,785 B2 | 10/2019 | Shim et al. |
| 10,453,802 B2 | 10/2019 | Hu |
| 10,497,635 B2 | 12/2019 | Brazzle et al. |
| 10,510,703 B2 | 12/2019 | Chi et al. |
| 10,510,720 B2 | 12/2019 | Lin et al. |
| 10,515,806 B2 | 12/2019 | Hunt et al. |
| 10,515,889 B2 | 12/2019 | Lu |
| 10,522,476 B2 | 12/2019 | Cheng et al. |
| 10,535,521 B2 | 1/2020 | Hunt et al. |
| 10,535,597 B2 | 1/2020 | Chen et al. |
| 10,548,249 B2 | 1/2020 | Mokler et al. |
| 10,553,487 B2 | 2/2020 | Zhao et al. |
| 10,573,624 B2 | 2/2020 | Chen et al. |
| 10,586,751 B2 | 3/2020 | Huang |
| 10,602,612 B1 | 3/2020 | Hoang et al. |
| 10,607,955 B2 | 3/2020 | Chiu et al. |
| 10,629,454 B2 | 4/2020 | Yeh |
| 10,629,531 B2 | 4/2020 | Lin |
| 10,636,756 B2 | 4/2020 | Yang et al. |
| 11,134,570 B2 | 9/2021 | Lu et al. |
| 11,272,618 B2 | 3/2022 | Brazzle et al. |
| 11,410,977 B2 | 8/2022 | Brazzle et al. |
| 2002/0089069 A1* | 7/2002 | Lamson .......... H01L 24/48 257/784 |
| 2003/0053286 A1* | 3/2003 | Masuda .......... H01G 9/10 361/523 |
| 2004/0124505 A1 | 7/2004 | Mahle et al. |
| 2004/0201081 A1 | 10/2004 | Joshi et al. |
| 2004/0222514 A1 | 11/2004 | Crane, Jr. et al. |
| 2004/0262774 A1 | 12/2004 | Kang et al. |
| 2005/0095835 A1 | 5/2005 | Humpston et al. |
| 2006/0186980 A1* | 8/2006 | Shafer .......... H01F 27/292 336/83 |
| 2007/0114352 A1 | 5/2007 | Cruz et al. |
| 2007/0222044 A1 | 9/2007 | Otremba |
| 2007/0246806 A1 | 10/2007 | Ong et al. |
| 2007/0262346 A1 | 11/2007 | Otremba et al. |
| 2007/0273049 A1 | 11/2007 | Khan et al. |
| 2008/0122049 A1 | 5/2008 | Zhao et al. |
| 2008/0128890 A1 | 6/2008 | Choi et al. |
| 2010/0013064 A1 | 1/2010 | Hsu |
| 2010/0133674 A1 | 6/2010 | Hebert et al. |
| 2011/0013349 A1 | 1/2011 | Morikita et al. |
| 2011/0115060 A1 | 5/2011 | Chiu et al. |
| 2011/0177654 A1 | 7/2011 | Lee et al. |
| 2011/0228507 A1* | 9/2011 | Yin .......... H05K 1/18 361/811 |
| 2011/0241194 A1 | 10/2011 | Chen et al. |
| 2011/0266699 A1 | 11/2011 | Hilt et al. |
| 2011/0292632 A1 | 12/2011 | Wen et al. |
| 2012/0025227 A1 | 2/2012 | Chan et al. |
| 2012/0074532 A1 | 3/2012 | Shih et al. |
| 2012/0139122 A1 | 6/2012 | Honjo |
| 2012/0181689 A1 | 7/2012 | Do et al. |
| 2012/0223428 A1 | 9/2012 | Pendse |
| 2012/0273960 A1 | 11/2012 | Park et al. |
| 2013/0015569 A1 | 1/2013 | Anderson et al. |
| 2013/0107469 A1 | 5/2013 | Wei et al. |
| 2013/0127029 A1 | 5/2013 | Lee et al. |
| 2013/0200527 A1 | 8/2013 | Yang et al. |
| 2013/0214369 A1 | 8/2013 | Jones et al. |
| 2013/0234324 A1 | 9/2013 | Cho et al. |
| 2013/0249051 A1 | 9/2013 | Saye |
| 2013/0299971 A1 | 11/2013 | Do et al. |
| 2013/0341786 A1 | 12/2013 | Hsu et al. |
| 2014/0110860 A1 | 4/2014 | Choi et al. |
| 2014/0124919 A1 | 5/2014 | Huang et al. |
| 2014/0138807 A1 | 5/2014 | Gowda et al. |
| 2014/0145319 A1 | 5/2014 | Meinhold et al. |
| 2014/0151880 A1 | 6/2014 | Kao et al. |
| 2014/0154843 A1 | 6/2014 | Liu et al. |
| 2014/0159251 A1 | 6/2014 | Marimuthu et al. |
| 2014/0251670 A1* | 9/2014 | Sakai .......... H05K 3/4015 29/832 |
| 2014/0264914 A1 | 9/2014 | Meyer et al. |
| 2014/0312503 A1 | 10/2014 | Seo |
| 2014/0361423 A1 | 12/2014 | Chi et al. |
| 2015/0061095 A1 | 3/2015 | Choi et al. |
| 2015/0084206 A1 | 3/2015 | Lin |
| 2015/0179570 A1 | 6/2015 | Marimuthu et al. |
| 2015/0179626 A1 | 6/2015 | Zhang et al. |
| 2015/0187710 A1 | 7/2015 | Scanlan et al. |
| 2015/0255360 A1* | 9/2015 | Hsu .......... H01L 25/50 438/127 |
| 2015/0279778 A1 | 10/2015 | Camacho et al. |
| 2015/0279815 A1 | 10/2015 | Do et al. |
| 2015/0325509 A1 | 11/2015 | We et al. |
| 2015/0325516 A1 | 11/2015 | Lin et al. |
| 2016/0035656 A1 | 2/2016 | Haba et al. |
| 2016/0066406 A1 | 3/2016 | Chen et al. |
| 2016/0071831 A1 | 3/2016 | Lee et al. |
| 2016/0088754 A1* | 3/2016 | Francis .......... H05K 7/026 361/752 |
| 2016/0126176 A1 | 5/2016 | Chang et al. |
| 2016/0150632 A1 | 5/2016 | Viswanathan et al. |
| 2016/0276256 A1 | 9/2016 | Chiang et al. |
| 2016/0284642 A1 | 9/2016 | Ganesan et al. |
| 2016/0307799 A1 | 10/2016 | Ho et al. |
| 2016/0322343 A1 | 11/2016 | Scanlan |
| 2016/0329272 A1 | 11/2016 | Geissler et al. |
| 2016/0343651 A1 | 11/2016 | Rae et al. |
| 2017/0011936 A1 | 1/2017 | Lin et al. |
| 2017/0062120 A1 | 3/2017 | Yun et al. |
| 2017/0077039 A1 | 3/2017 | Liao et al. |
| 2017/0077364 A1 | 3/2017 | Renn et al. |
| 2017/0098610 A1 | 4/2017 | Shim et al. |
| 2017/0110392 A1 | 4/2017 | Lin et al. |
| 2017/0125389 A1 | 5/2017 | Kulick et al. |
| 2017/0148746 A1 | 5/2017 | Chiu et al. |
| 2017/0162476 A1 | 6/2017 | Meyer et al. |
| 2017/0179041 A1 | 6/2017 | Dias et al. |
| 2017/0179048 A1 | 6/2017 | Moussaoui et al. |
| 2017/0186702 A1 | 6/2017 | Liang et al. |
| 2017/0221858 A1 | 8/2017 | Yu et al. |
| 2017/0250172 A1 | 8/2017 | Huang et al. |
| 2017/0256481 A1 | 9/2017 | Chen et al. |
| 2017/0278807 A1 | 9/2017 | Chiu et al. |
| 2017/0311447 A1 | 10/2017 | Brazzle et al. |
| 2018/0052281 A1 | 2/2018 | Kuo et al. |
| 2018/0061815 A1 | 3/2018 | Fang et al. |
| 2018/0068970 A1 | 3/2018 | Tanida et al. |
| 2018/0068983 A1 | 3/2018 | Chang et al. |
| 2018/0076165 A1 | 3/2018 | Aoki et al. |
| 2018/0090466 A1 | 3/2018 | Hung |
| 2018/0102325 A1 | 4/2018 | Yu et al. |
| 2018/0130774 A1 | 5/2018 | Lin et al. |
| 2018/0138113 A1 | 5/2018 | Chen et al. |

(56) References Cited

U.S. PATENT DOCUMENTS

| | | |
|---|---|---|
| 2018/0138131 A1 | 5/2018 | Kawabata |
| 2018/0151485 A1 | 5/2018 | Kao et al. |
| 2018/0158779 A1 | 6/2018 | Yang et al. |
| 2018/0182704 A1 | 6/2018 | Yeh |
| 2018/0261551 A1 | 9/2018 | Lee et al. |
| 2018/0269708 A1 | 9/2018 | Yeh |
| 2018/0297834 A1 | 10/2018 | Renaud-Bezot et al. |
| 2018/0301269 A1* | 10/2018 | Sundaram ............. H01L 23/373 |
| 2018/0331018 A1 | 11/2018 | Shim et al. |
| 2018/0331050 A1 | 11/2018 | Chung et al. |
| 2018/0337130 A1 | 11/2018 | Chang Chien et al. |
| 2018/0342484 A1 | 11/2018 | Chiu et al. |
| 2018/0350766 A1 | 12/2018 | Sato et al. |
| 2018/0374798 A1 | 12/2018 | Lee et al. |
| 2018/0374833 A1 | 12/2018 | Wong et al. |
| 2019/0013301 A1 | 1/2019 | Cheah et al. |
| 2019/0019763 A1 | 1/2019 | Chang et al. |
| 2019/0043819 A1 | 2/2019 | Ho et al. |
| 2019/0051590 A1 | 2/2019 | Fang et al. |
| 2019/0057940 A1 | 2/2019 | Cheah et al. |
| 2019/0115143 A1* | 4/2019 | Tachibana ............. H01F 27/292 |
| 2019/0115319 A1 | 4/2019 | Hiner et al. |
| 2019/0132983 A1 | 5/2019 | Weis et al. |
| 2019/0139846 A1 | 5/2019 | Lu |
| 2019/0139946 A1 | 5/2019 | Kim et al. |
| 2019/0141834 A1 | 5/2019 | Brazzle et al. |
| 2019/0148304 A1 | 5/2019 | Gavagnin et al. |
| 2019/0206799 A1 | 7/2019 | Keser et al. |
| 2019/0237374 A1 | 8/2019 | Huang et al. |
| 2019/0252305 A1 | 8/2019 | Peng et al. |
| 2019/0273044 A1 | 9/2019 | Fu et al. |
| 2019/0304807 A1 | 10/2019 | Baloglu et al. |
| 2019/0304865 A1 | 10/2019 | Brazzle et al. |
| 2019/0304936 A1 | 10/2019 | Shaul et al. |
| 2019/0319337 A1 | 10/2019 | Yen |
| 2019/0355654 A1 | 11/2019 | Xu et al. |
| 2019/0363423 A1 | 11/2019 | Lu et al. |
| 2019/0371621 A1 | 12/2019 | Darmawikarta et al. |
| 2019/0393140 A1 | 12/2019 | Yeh et al. |
| 2020/0006089 A1 | 1/2020 | Yu et al. |
| 2020/0006253 A1 | 1/2020 | Cheah et al. |
| 2020/0006295 A1 | 1/2020 | Yang et al. |
| 2020/0051927 A1 | 2/2020 | Lin et al. |
| 2020/0075490 A1 | 3/2020 | Sung et al. |
| 2020/0075562 A1 | 3/2020 | Yu et al. |
| 2020/0083591 A1 | 3/2020 | Hsieh et al. |
| 2020/0091059 A1 | 3/2020 | Lin et al. |
| 2020/0105653 A1 | 4/2020 | Elsherbini et al. |
| 2020/0111717 A1 | 4/2020 | Gmunder et al. |
| 2020/0111748 A1 | 4/2020 | Leitgeb |
| 2020/0120794 A1 | 4/2020 | Somada et al. |
| 2020/0126921 A1 | 4/2020 | Nair et al. |
| 2020/0144198 A1 | 5/2020 | Lee et al. |
| 2020/0152372 A1 | 5/2020 | Wei et al. |
| 2020/0152614 A1 | 5/2020 | Brazzle et al. |
| 2020/0185293 A1 | 6/2020 | Schmalzl et al. |
| 2020/0185330 A1 | 6/2020 | Yu et al. |
| 2020/0205279 A1 | 6/2020 | Ecton et al. |
| 2020/0211927 A1 | 7/2020 | Wan et al. |
| 2021/0082790 A1 | 3/2021 | Zhang et al. |
| 2021/0111084 A1 | 4/2021 | Brazzle et al. |
| 2021/0143786 A1* | 5/2021 | Aizawa ................... H01F 27/29 |
| 2021/0375528 A1* | 12/2021 | Hoshino ................. H01F 27/06 |
| 2022/0255249 A1* | 8/2022 | Kikuta ............... H01R 13/2464 |

FOREIGN PATENT DOCUMENTS

| | | |
|---|---|---|
| CN | 201893335 U | 7/2011 |
| CN | 203839367 U | 9/2014 |
| CN | 104221145 | 12/2014 |
| CN | 104934391 | 9/2015 |
| CN | 107170718 | 9/2017 |
| CN | 109075151 | 12/2018 |
| CN | 110299329 | 10/2019 |
| CN | 110364491 | 10/2019 |
| CN | 111108598 | 5/2020 |
| CN | 111149201 | 5/2020 |
| EP | 0384927 | 9/1990 |
| EP | 2381472 | 10/2011 |
| EP | 3217774 | 9/2017 |
| JP | S59-155154 | 9/1984 |
| KR | 10-0652518 | 12/2006 |
| KR | 20200010521 | 1/2020 |
| WO | WO 2010/067508 | 6/2010 |
| WO | WO 2017/189224 | 11/2017 |
| WO | WO 2019/066986 | 4/2019 |
| WO | WO 2019/066987 | 4/2019 |
| WO | WO 2019/132963 | 7/2019 |
| WO | WO 2019/132965 | 7/2019 |
| WO | WO 2021/124691 | 6/2021 |

OTHER PUBLICATIONS

English Translation JP59155154 (Year: 1984).*
Office Action in Chinese Application No. 201780025431.5, dated Nov. 30, 2021.
International Search Report and Written Opinion for International Application No. PCT/US2019/021908, dated Aug. 27, 2019, in 16 pages.
International Search Report and Written Opinion for application No. PCT/US2017/027047, dated Jun. 29, 2017, in 10 pages.
International Preliminary Report on Patentability for application No. PCT/US2017/027047, dated Oct. 30, 2018, in 7 pages.
International Preliminary Report on Patentability for application No. PCT/US2019/021908, dated Sep. 29, 2020, in 9 pages.
Final Office Action in U.S. Appl. No. 15/495,405, dated Oct. 18, 2018, in 17 pages.
Non-Final Office Action in U.S. Appl. No. 15/495,405, dated Apr. 5, 2018, in 12 pages.
Response in U.S. Appl. No. 15/495,405, filed Jun. 12, 2018, in 8 pages.
Office Action in Taiwan Application No. 106113400, dated Jul. 4, 2018, with concise statement of relevance, in 5 pages.
Response in Taiwan Application No. 106113400, filed Jan. 9, 2019, with English claims, in 4 pages.
Office Action in Taiwan Application No. 106113400, dated Jan. 16, 2019, in 10 pages.
Response in Taiwan Application No. 106113400, filed Apr. 3, 2019, with English claims, in 16pages.
Office Action in Taiwan Application No. 106113400, dated Apr. 29, 2019, with English translation, in 4 pages.
Response to Communication Pursuant to Rules 161(1) and 162 EPC, with English Claims, in European Application No. 17719130.1, filed Jun. 3, 2019, in 24 pages.
Partial Search Report in European Application No. 21175552.5, dated Oct. 29, 2021, in 11 pages.
"DW3316 Coupled Inductors for xDSL", Document 232, revised Nov. 9, 2020, www.coilcraft.com, 1 page.
Office Action with English translation in Chinese Application No. 201780025431.5, dated Jul. 18, 2022.
Office Action in Chinese Application No. 201980000486.X, dated Sep. 20, 2022.
Office Action in Chinese Application No. 201980000486.X, dated Jun. 29, 2023.
International Search Report and Written Opinion in application No. PCT/US2023/064298, dated Jun. 30, 2023, in 12 pages.

* cited by examiner

ELECTRONIC COMPONENT

INCORPORATION BY REFERENCE TO ANY PRIORITY APPLICATIONS

This application claims priority to U.S. Provisional Patent Application No. 63/033,665, filed Jun. 2, 2020, the entire contents of which are hereby incorporated by reference in their entirety and for all purposes.

BACKGROUND

Field of the Invention

The field relates to an electronic component, and, in particular, to an electronic component with partially insulated leads, and particularly a staple lead inductor, and moreover, to a component-on-package (CoP) arrangement incorporating such a component.

Description of the Related Art

It is common to provide an integrated circuit, or a circuit formed of discrete components, in a single sealed package having a standardized terminal configuration (e.g., ball grid array, in-line pins, surface mount leads, etc.). The terminals of the package are typically then soldered to a printed circuit board along with other packages and components. Relevant factors in a package design may include for example size, terminal count, heat dissipation, current/voltage requirements, and electrical/magnetic interference issues.

For certain applications, some electronic devices provide electrical interconnections with increased power and current capabilities, as well as a reduced footprint on the system board to which the electronic device is mounted. For example, US Patent Publication Nos. US 2017/0311447 (filed Apr. 24, 2017, hereinafter "the '447 Publication"); US 2019/0141834 (filed Oct. 19, 2018); US 2019/0304865 (filed Oct. 4, 2018); and US 2020/0152614 (filed Nov. 12, 2019; hereinafter "the '614 Publication") provide various examples of such electronic devices, the entire contents of each of which are incorporated by reference herein in their entirety and for all purposes. For example, some packages similar to those described in the '447 Publication utilize an internal leadframe architecture which can be used to provide an electrical and thermal interconnect between the substrate, inner components, and external components. Other electronic devices can use vertical interconnects like those described in the '614 Publication to provide high power electrical interconnection between a component and a substrate of an underlying package. However, it can be challenging to form a reliable electrical connection between the component and the underlying substrate. Accordingly, there remains a continuing need for improved electrical connection between an externally attached (CoP) component and an underlying substrate.

SUMMARY

An electronic device is disclosed. In one embodiment, the electronic device includes: an integrated device package including a substrate and a package body over the substrate, and a hole formed through the package body to expose a conductive pad of the substrate; a component mounted over the package body, the component including a component body and a lead extending from the component body through the hole, the lead including an insulated portion and a distal exposed portion, the insulated portion including a conductor and an insulating layer disposed about the conductor, the distal exposed portion being uncovered by the insulating layer such that the conductor is exposed at the distal portion; and a conductive material that electrically connects the distal exposed portion to the conductive pad of the substrate.

In some embodiments, the distal exposed portion extends from a distal end of the lead to a terminal edge of the insulating layer, the terminal edge disposed at or above a bottom surface of the component body. In some embodiments, the terminal edge is disposed at a distance in a range of 0 mm to 2 mm above the bottom surface of the component body. In some embodiments, the terminal edge is disposed at a distance in a range of 0 mm to 1.2 mm above the bottom surface of the component body. In some embodiments, the insulating portion extends from the component body to the terminal edge. In some embodiments, the component includes an inductor. In some embodiments, the inductor includes a conductive material and a ferrite material in which the conductive material is encased, the insulating layer covering the conductive material embedded in the ferrite material. In some embodiments, the package body includes a molding compound. In some embodiments, the integrated device package includes one or a plurality of integrated device dies mounted to the substrate, the integrated device dies at least partially embedded in the molding compound. In some embodiments, the conductive material includes solder. In some embodiments, the component is mounted to the package body by way of an adhesive. In some embodiments, a distal end of the lead is spaced above the conductive pad and does not contact the conductive pad. In some embodiments, the component includes a second hole through the package body and a second lead extending through the second hole to electrically connect to a second conductive pad of the substrate. In some embodiments, the second lead includes a second insulated portion coated by the insulating layer and a second distal exposed portion, the second distal exposed portion being uncovered by the insulating layer.

In another embodiment, an electronic component includes: a component body; a conductor including: a horizontal electrode portion extending continuously through the component body; a first lead extending downwardly along a first side of the component body from the horizontal electrode portion; and a second lead extending downwardly along a second side of the component body from the horizontal electrode portion; and an insulating layer disposed about the conductor along at least a portion of a length of the conductor.

In some embodiments, the conductor does not include any coils or turns within the component body. In some embodiments, each of the first and second leads includes an insulated portion coated by the insulating layer and a distal exposed portion uncovered by the insulating layer such that the conductor is exposed at the distal portion. In some embodiments, the distal exposed portion extends from a distal end of each lead to a terminal edge of the insulating layer, the terminal edge disposed at or above a bottom surface of the component body. In some embodiments, the terminal edge is disposed at a distance in a range of 0 mm to 2 mm above the bottom surface of the component body. In some embodiments, the terminal edge is disposed at a distance in a range of 0 mm to 1.2 mm above the bottom surface of the component body. In some embodiments, the distal exposed portion is plated with a solderable material. In some embodiments, the package body includes a ferrite material. In some embodiments, the insulating layer coats the horizontal electrode portion. In some embodiments, the first side is opposite the second side.

Furthermore, a method of forming an electronic device with a package structure is disclosed. In one embodiment, the method includes: providing a substrate having a top surface; mounting a package body on the top surface of the substrate; forming a hole through the package body to expose a conductive pad of the substrate; mounting a component over the package body, wherein the component includes a component body and a lead extending from the component body through the hole, and the lead includes an insulated portion and a distal exposed portion, the insulated portion including a conductor and an insulating layer disposed about the conductor; and electrically connecting the distal exposed portion to the conductive pad of the substrate via a conductive material.

In some embodiments, the method further includes uncovering the distal exposed portion such that the conductor is exposed at the distal portion, wherein uncovering the distal exposed portion includes uncovering the distal exposed portion such that the distal exposed portion extends from a distal end of the lead to a terminal edge of the insulating layer, and the terminal edge is disposed at or above a bottom surface of the component body. In some embodiments, uncovering the distal exposed portion includes uncovering the distal exposed portion such that the terminal edge is disposed at a distance in a range of 0 mm to 2 mm above the bottom surface of the component body. In some embodiments, uncovering the distal exposed portion includes uncovering the distal exposed portion such that the terminal edge is disposed at a distance in a range of 0 mm to 1.2 mm above the bottom surface of the component body. In some embodiments, uncovering the distal exposed portion includes uncovering the distal exposed portion such that the insulating portion extends from the component body to the terminal edge. In some embodiments, mounting the component includes mounting an inductor. In some embodiments, the inductor includes a conductive material and a ferrite material in which the conductive material is encased, such that the insulating layer covers the conductive material embedded in the ferrite material. In some embodiments, the package body includes a molding compound. In some embodiments, the integrated device package includes one or a plurality of integrated device dies mounted to the substrate, such that the integrated device dies are at least partially embedded in the molding compound. In some embodiments, electrically connecting the distal exposed portion to the conductive pad of the substrate via the conductive material includes electrically connecting via solder. In some embodiments, mounting the component includes mounting the component to the package body by way of an adhesive. In some embodiments, mounting the component includes mounting the component such that a distal end of the lead is spaced above the conductive pad and does not contact the conductive pad. In some embodiments, the method further includes: forming a second hole through the package body; and mounting the component such that a second lead of the component extends through the second hole to electrically connect to a second conductive pad of the substrate. In some embodiments, the second lead includes a second insulated portion coated by the insulating layer and a second distal exposed portion, the second distal exposed portion being uncovered by the insulating layer. In some embodiments, the method further includes plating the distal exposed portion with a solderable material. In some embodiments, the package body includes a ferrite material. In some embodiments, the lead is disposed on a first side of the component, and the second lead is disposed on a second side of the component, wherein the first side is opposite the second side.

DETAILED DESCRIPTION

Figure 1:
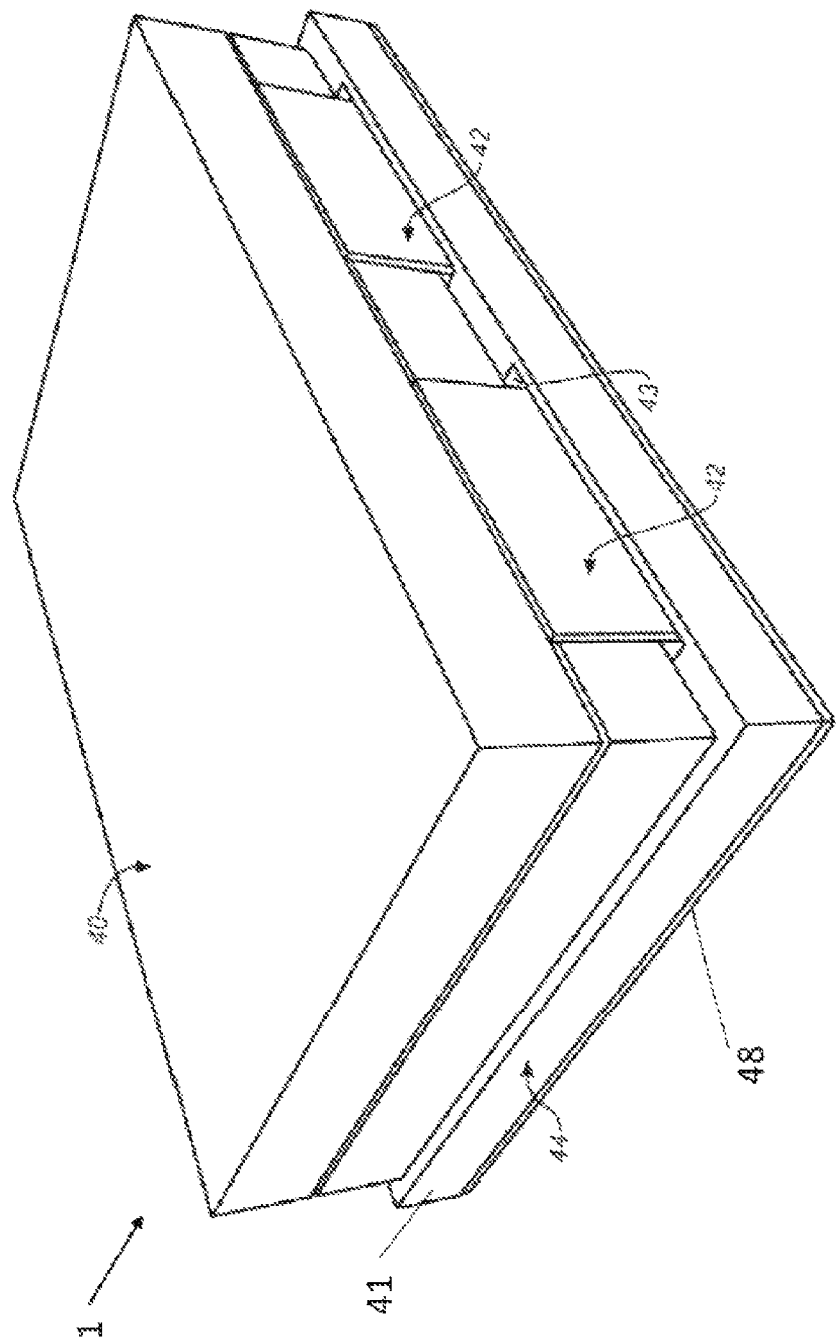
FIG. 1 is a schematic perspective view of an electronic device that includes a component mounted on a package.
Figure 2:
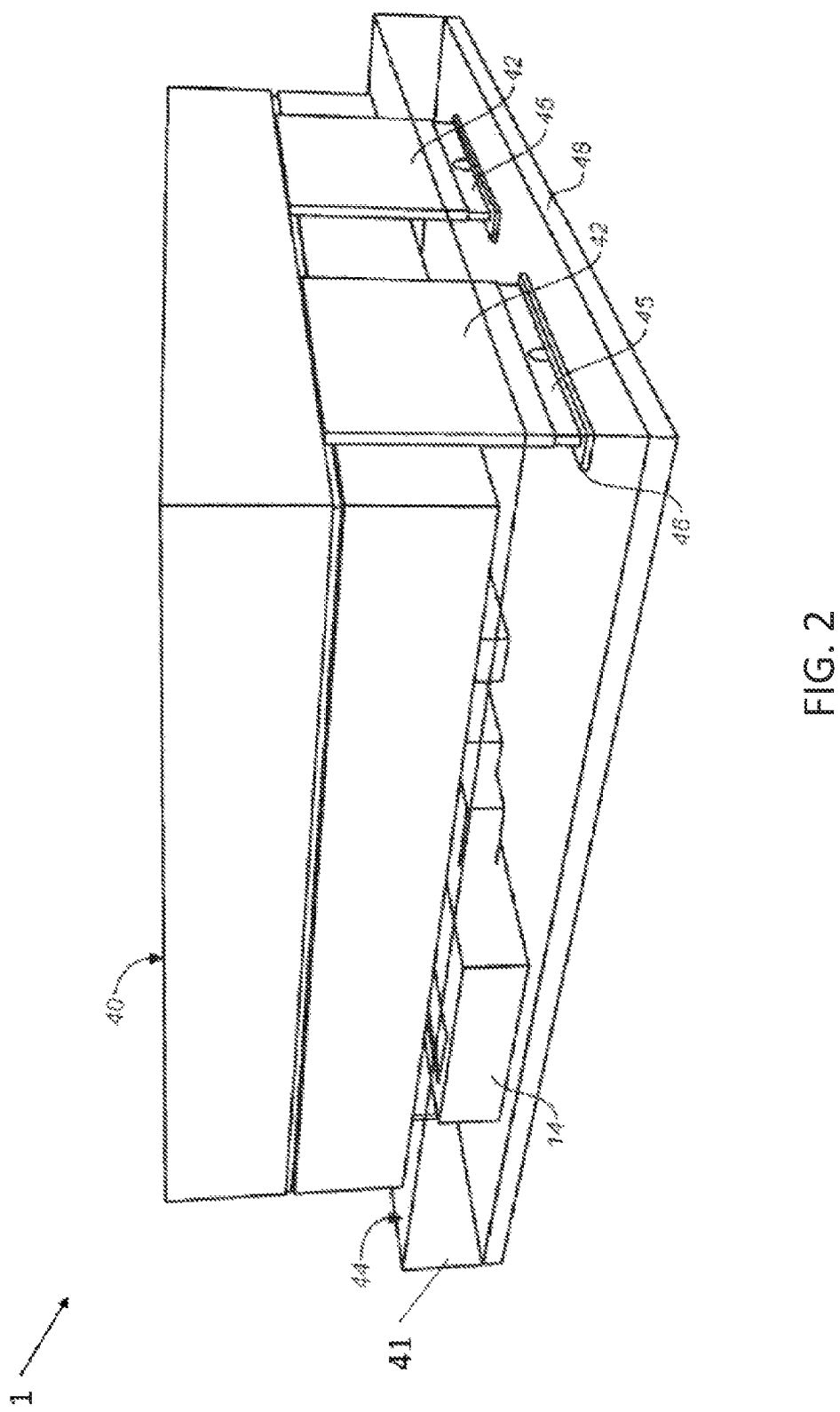
FIG. 2 is a schematic perspective view of the electronic device of FIG. 1, with a molding compound.

FIG. 1 is a schematic perspective view of an electronic device 1 comprising a component 40 mounted on a package 44. FIG. 2 is a schematic perspective view of the electronic device 1 of FIG. 1, with a molding compound 41 shown as transparent for ease of illustration. In the illustrated embodiment, the component 40 comprises a high power inductor for a switching regulator. The package 44 can comprise an integrated device package having one or a plurality of integrated device dies 14 mounted to a substrate 48.

The substrate 48 can comprise any suitable type of package substrate, e.g., a printed circuit board (PCB), a leadframe, a ceramic substrate, etc. The integrated device dies 14 can comprise any suitable type of electronic chip and can be electrically connected to the substrate 48. In various embodiments, for example, the integrated device die(s) 14 can be flip chip mounted to the substrate 48, e.g., by way of solder balls. In other embodiments, the integrated device die(s) 14 can be adhered and wire bonded to the substrate 48. It should be appreciated that one or more other types of components (such as passive electronic devices like resistors, capacitors, inductors, etc.) may additionally or alternatively be mounted and electrically connected to the substrate 48.

The molding compound 41 can comprise an insulating encapsulant, such as an epoxy, that is applied over the die(s) 14 and an upper surface of the substrate 48. The molding compound 41 can serve to protect the die(s) 14 and other components mounted to the substrate 48. As shown, a bottom surface of the component 40 can be mounted (e.g., adhered with epoxy) to a top surface of the molding compound 41 of the bottom package 44, using, for example, an epoxy 47 (see FIG. 3). The component 40 can electrically connect to one or more conductive pads 46 on the substrate 48 of the package 44 by way of a corresponding one or more holes 43 provided through the molding compound 41. For example, in the illustrated embodiment, the holes 43 can comprise laser drilled holes formed by irradiating the molding compound 41 with a laser to expose the conductive pads 46 on the substrate 48. In the illustrated embodiment, the holes 43 comprise elongated slots, which can have a rectangular shape. In other arrangements, similar holes can be provided through other insulating materials, such as FR4 insulating layers, e.g., for direct mounting of the component 40 into a receiving slot on a system board.

Figure 3:
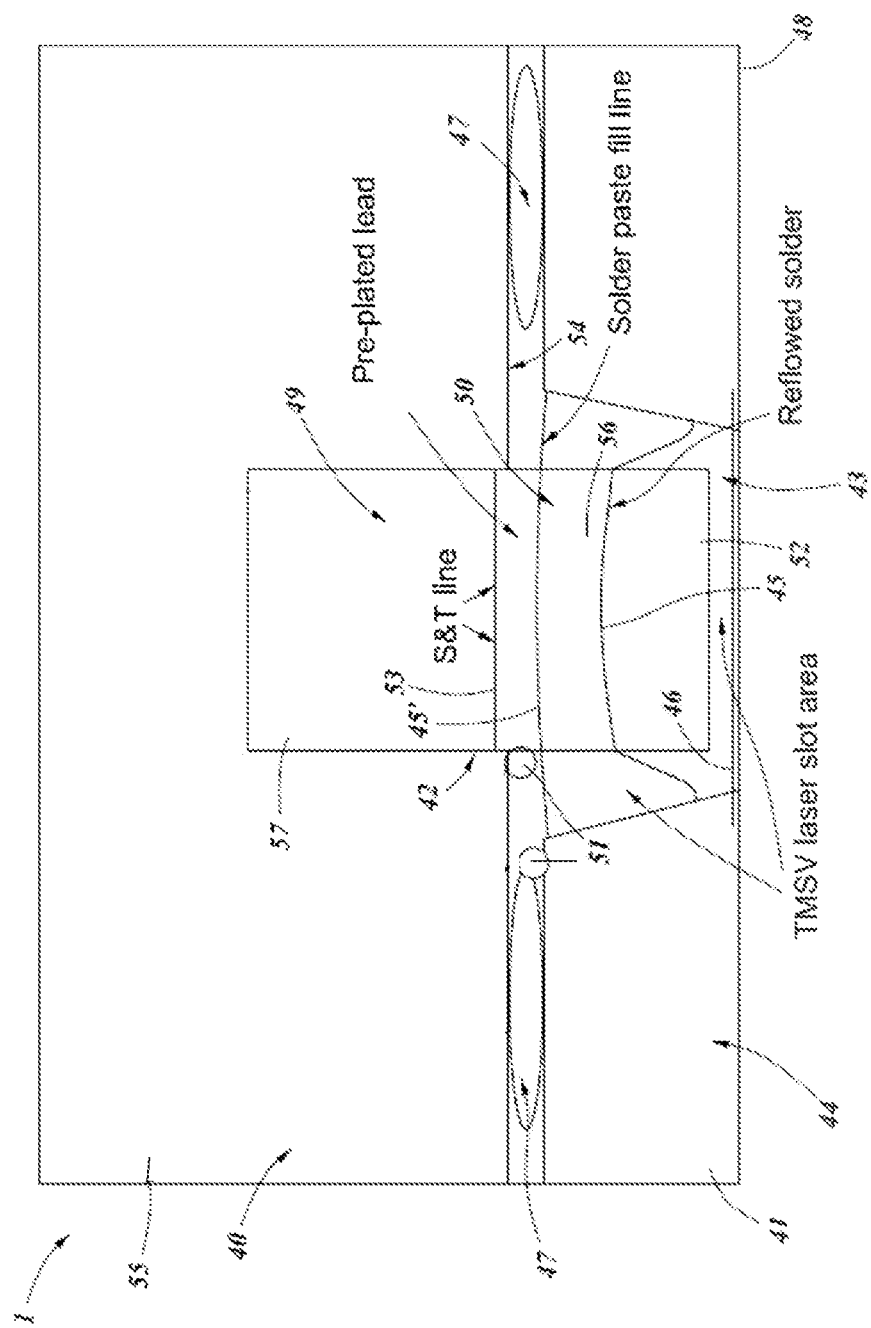
FIG. 3 is a schematic side sectional view of an electronic device, according to an embodiment.

The component 40 can comprise one or a plurality of leads 42 extending downward from the component 40 and through the holes 43. In the illustrated embodiment, the leads 42 can comprise staple leads, e.g., thin and wide leads that are good conductors for high currents and heat. In one embodiment, the component 40 can comprise an inductor encased in a ferrite material which is highly thermally conductive. In other embodiments, the component 40 can comprise a transformer, or other suitable type of electrical component. In the illustrated embodiment, two staple leads 42 are illustrated along one side of the electronic device 1, but it should be appreciated that the opposing side of the electronic device 1 may also include an additional two leads 42 (not shown in FIGS. 1-2). The four leads 42 of the illustrated embodiment represent two staple lead inductors with a common ferrite body, but the skilled artisan will appreciate that principles and advantages taught herein are applicable to components having 2, 4, 6, 8 or any even number of staple leads. (See for example FIGS. 5-6 as discussed herein.) The leads 42 can extend through the holes 43 in the bottom package 44 and may or may not abut the metal pads 46 formed on the substrate 48 of the bottom package 44. In the embodiments of FIGS. 2 and 3, the leads 42 do not directly contact the metal pads 46; rather, electrical contact is made by way of an intervening conductive adhesive. For example, the holes 43 can be partially filled with a conductive material 45 (e.g., solder) that reflows and adheres to the pads 46 and the leads 42 to provide an electrical, thermal, and mechanical connection between the component 40 and the pads 46. In the illustrated embodiment, the conductive material 45 also provides electrical, thermal and mechanical connection between the component and the substrate 48 of the package 44.

In the electronic device 1 shown in FIGS. 1 and 2, the leads 42 can comprise a conductive material along the entire length of the lead 42. When the leads 42 of FIGS. 1 and 2 are soldered to the conductive pads 46 of the substrate 48, the conductive material 45 (e.g., solder) can wick upwardly along the conductive material of the lead 42. Excessive upward wicking of the conductive material 45 can vertically spread and thin the conductive material 45 between the lead 42 and the pad 46 and reduce reliability of the resulting solder joint.

Figure 4:
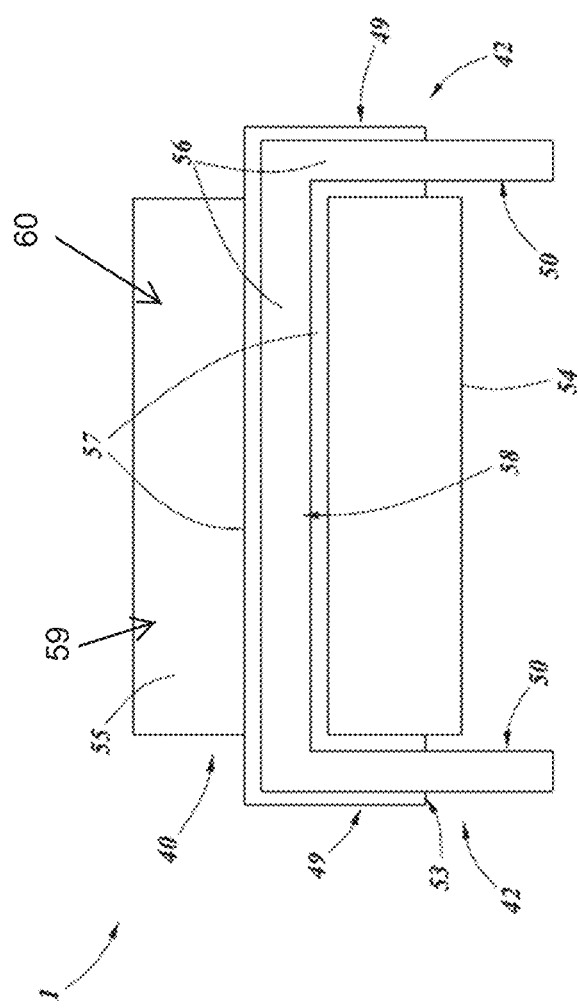
FIG. 4 is a schematic end view of a component that includes an inductor that can be used in the electronic device of FIG. 3, according to an embodiment.

FIG. 3 is a schematic side sectional view of an electronic device 1 according to one embodiment. FIG. 4 is a schematic end view of a component 40 that includes an inductor that can be used in the electronic device 1 of FIG. 3, shown separate from the substrate 48. Unless otherwise noted, the components of FIG. 3 may be the same as or generally similar to like-numbered components of FIGS. 1-2. For example, the electronic device 1 can include the integrated device package 44 and the component 40 mounted to the integrated device package 44, for example, with an adhesive 47. Although not shown in FIG. 3, the package 44 can comprise one or a plurality of devices, such as the integrated device dies 14 (FIG. 2), mounted to the substrate 48. The molding compound 41 can be provided over the dies 14 and portions of the upper surface of the substrate 48. The molding compound 41 can at least partially define a package body. As explained above, a hole 43 can be formed through the package body (e.g., the molding compound 41). In other embodiments, the hole 43 can be formed through any insulating material of a receiving carrier, such as a system board, to expose a contact pad to be contacted by the component leads.

The component 40 can comprise a component body 55 and a lead 42 extending from the component body 55 through the hole 43. In the illustrated embodiment, the lead 42 can include an insulated portion 49 and a distal exposed portion 50 below the line labeled "S&T line" in FIG. 3. The insulated portion 49 can include a conductor 56 and an insulating layer 57 disposed about the conductor 56. As shown, the distal exposed portion 50 can be uncovered by the insulating layer 57 such that the conductor 56 is exposed at the distal portion. A conductive material 45 (e.g., solder) can electrically connect the distal exposed portion 50 (e.g., the conductor 56) to the conductive pad 46 of the substrate 48. In FIG. 3, the conductive material 45 is shown in a reflowed state (e.g., after a solder reflow process).

In various embodiments, the insulating layer 57 can comprise a coating, and particularly a polymer layer, such as polyimide, although other insulating materials may be used. In some embodiments, the insulating layer 57 can be deposited over the conductor 56 as a coating, as opposed to a native insulating material. The insulating layer 57 can have any suitable thickness to serve the function of preventing excessive wicking without interfering with the conductor 56 electrical function (e.g., inductance). For example, the insulating layer 57 can have a thickness between about 0.01 mm and 0.10 mm, more particularly between about 0.06 mm and 0.09 mm. The insulating layer 57 is formed over the conductor 56, including both a horizontal electrode portion 58 of the conductor 56 (not shown) and vertical lead 42 portions of the conductor 56, prior to embedding (e.g., by molding) the horizontal electrode portion 58 (see FIG. 4) in the component body 55, which is a ferrite material 59 for the illustrated inductor embodiment. As shown in FIG. 4, the insulated lead 42 turns inwardly about 90° at the top of the lead 42 to form the horizontal inductor electrode 58 extending continuously through the component body 55 (into the page in the view of FIG. 3), and is bent about 90° downwardly to form a similar lead 42 on the other side of the component body 55. Thus, unlike conventional inductors, the staple lead inductor of the illustrated embodiment does not include any coils or turns within the ferrite body.

The conductor 56 can comprise any suitable metal. For example, in various embodiments, the conductor 56 can comprise copper. As shown, the distal exposed portion 50 can be formed by stripping a distal portion of the insulating layer 57 to expose the conductor 56. The insulating layer 57 can be stripped to a terminal edge 53 of the remaining portion of the insulating layer 57 (also referred to as a "strip and tinned lines," or "S&T line" in FIG. 3). In some embodiments, the conductor 56 can be plated with a solderable material (e.g., tin) before being coated with the insulating layer 57. In the illustrated embodiment, the distal exposed portion 50 of conductor 56 is plated with the solderable material (or "tinned") after stripping the distal portion of the insulating layer 57.

As shown in FIG. 3, during a reflow process, the conductive material can be provided in the hole 43 to a solder paste fill line 45' prior to reflow. After reflow, the increased temperature can cause flux, solvents, and other materials to evaporate, and the conductive material 45 can harden within the hole 43 at a location substantially below the fill line 45'. During reflow, if the terminal edge 53 of the insulating layer 57 is placed too high relative to the solder fill line 45', then the solder may wick upwardly along the conductor 56 and risk insufficient material for electrical, mechanical and thermal connection between the lead 42 and the pad 46. By contrast, if the terminal edge 53 of the insulating layer 57 is placed too low relative to the fill line 45', then the solder may react with the insulating material of the insulating layer 57 to produce solder beads 51. Solder beads 51 can migrate during or after the reflow process and produce reliability problems for the electronic device 1. For example, the solder beads 51 may cause shorts between conductive components of the electronic device 1, crosstalk, or other problems.

The terminal edge 53 of the insulating layer 57 can be positioned at a height relative to a bottom surface 54 of the component body 55 and the solder fill line 45' that is sufficiently low so as to prevent the conductive material 45 from wicking upwardly during reflow and the attendant reliability problems associated with wicking. Moreover, the terminal edge 53 of the insulating layer 57 can be placed sufficiently high relative to the bottom surface 54 of the component body 55 and the solder fill line 45' so as to prevent the formation of solder beads 51 caused by the reaction between the insulating layer 57 and the conductive material 45 during reflow.

In the illustrated embodiment, the distal exposed portion 50 of the lead, which is preferably also tinned, extends from a distal end 52 of the lead 42 to the terminal edge 53 of the insulating layer 57. The insulating portion 49 can extend from the component body 55 to the terminal edge 53, but the insulating sleeve or layer 57 also coats the extension of the electrode from the lead 42 through the component body and to the lead 42 on the other side of the component body 55. The terminal edge 53 can be disposed at or above the bottom surface 54 of the component body 55. For example, the terminal edge 53 can be disposed at a distance in a range of 0 mm to 2 mm above the bottom surface 54 of the component body 55, e.g., at a distance in a range of 0 mm to 1.2 mm above the bottom surface 54 of the component body 55, in a range of 0.1 mm to 1.2 mm above the bottom surface 54 of the component body 55, in a range of 0.25 mm to 1.2 mm above the bottom surface 54 of the component body 55, or in a range of 0.5 mm to 1.2 mm above the bottom surface 54 of the component body 55.

As shown, the distal end 52 of the lead 42 can be spaced above the conductive pad 46 such that the distal end 52 does not contact the conductive pad 46. The spacing between the conductive pad 46 and the distal end 52 of the lead 42 can be controlled by the design of the component 40 itself (including the component body 55 and lead 42 geometries), the thickness of the package molding compound 41 or other insulating layer in which the hole 43 is formed, and the thickness of the adhesive (epoxy 47) between the component 40 and the underlying package 44 or other carrier. Such spacing can improve the planarity of the component 40 after mounting in some embodiments. The conductive material 45 can span the gap to electrically, mechanically and thermally connect the conductor 56 and the pad 46.

As explained above, in the illustrated embodiment, the component 40 comprises an inductor. The inductor can comprise a conductive material 60 and a ferrite material 59 in which the conductive material 60 is encased. Further, the inductor can comprise a staple lead inductor having a straight electrode within the ferrite component body 55 (i.e., no coil, representing a single turn in some embodiments). The leads 42 of the staple inductor can be sufficiently wide so as to convey a large amount of current for high power applications. For example, in some embodiments, the component 40 can be operated at high and low currents, e.g., at currents in a range of 0.1 A to 250 A, e.g., in a range of 5 A to 100 A (e.g., at least 1 A or at least 5 A). The inductor can have any suitable inductance, e.g., an inductance in a range of 10 µH to 100 mH. The component 40 can also have any suitable size. In various embodiments, the component 40 can have a vertical height in a range of 1 mm to 20 mm, or in a range of 3 mm to 9 mm.

FIG. 3 illustrates one lead 42, but it should be appreciated that the component 40 (e.g., an inductor) can comprise a plurality of leads 42 (e.g., 2, 4, 6, 8 or more) as shown in FIG. 4. For example, in some embodiments, the package 44 or other carrier can comprise a second hole 43 (not shown) and the component 40 comprises a second lead 42 (shown in FIG. 4) extending into the second hole 43 to electrically connect to a second conductive pad 46 (not shown) of the substrate 48. The second lead 42 may be the same as or generally similar to the lead 42 shown in FIG. 3, and may extend from an opposite end of the horizontal electrode portion 58 of the conductor embedded in the component body 55. For example, the second lead 42 can comprise an insulated portion 49 and a second distal exposed portion 50. The insulated portion 49 can include a segment of the conductor 56 and the insulating layer 57 disposed about the conductor 56. The second distal exposed portion 50 can be uncovered by the insulating layer 57.

Figure 5:
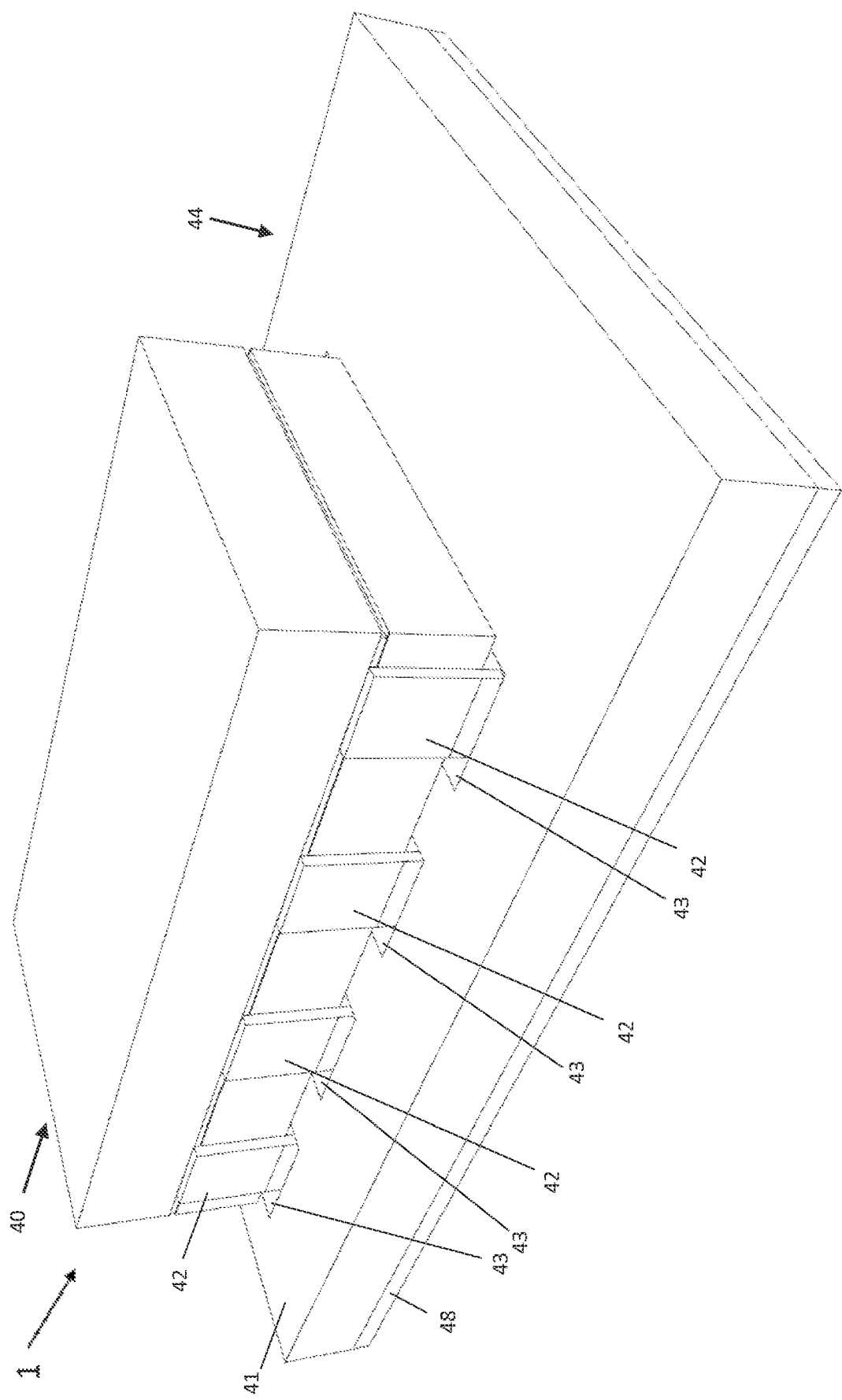
FIG. 5 is a schematic perspective view of an electronic device that includes a component mounted on a package, according to another embodiment.
Figure 6:
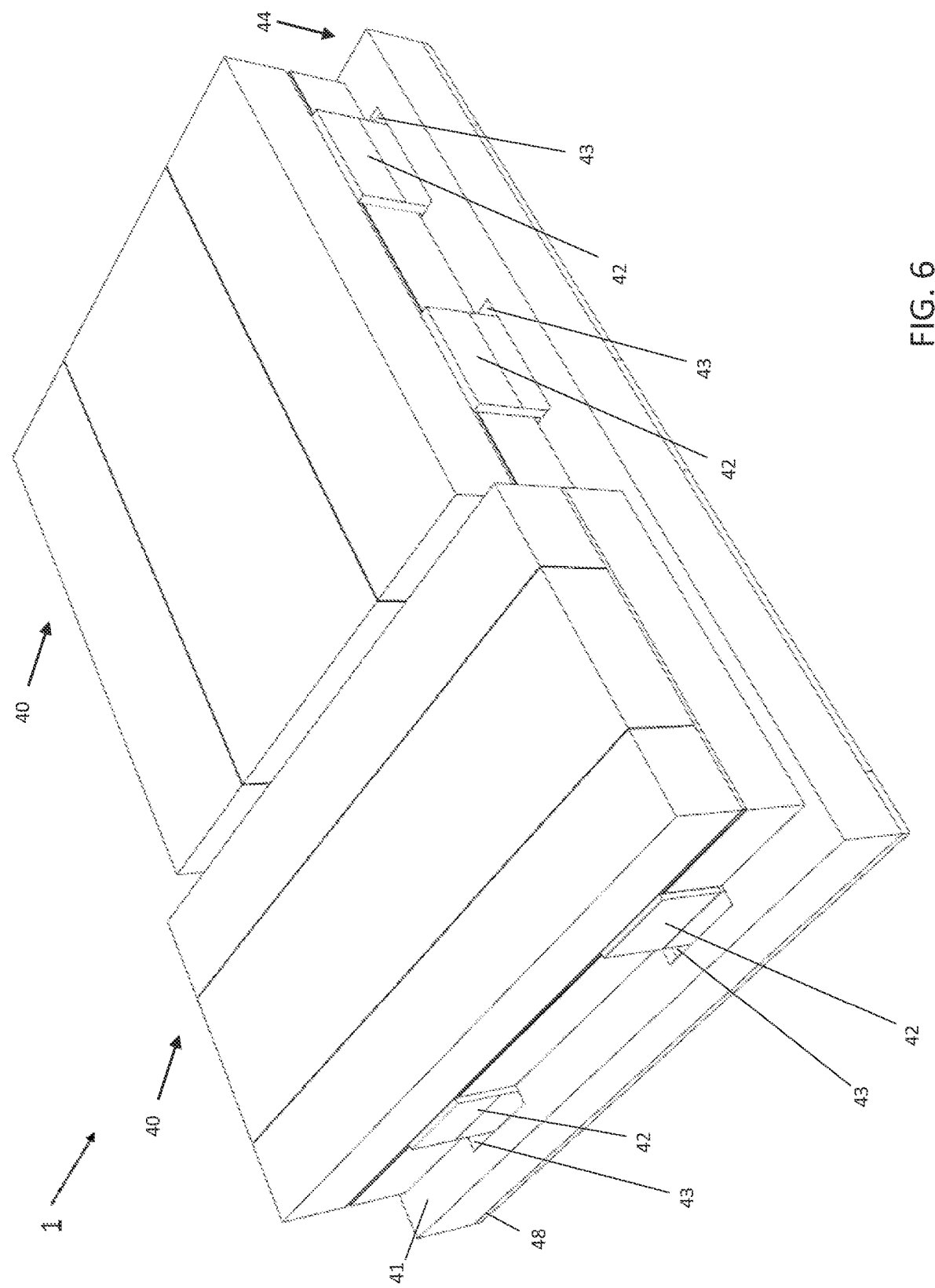
FIG. 6 is a schematic perspective view of an electronic device that includes multiple components mounted on a package, according to an embodiment.

FIGS. 5-6 each illustrate another embodiment of the electronic device 1 shown in FIG. 1. The previously described lead design structures can be applied to, but not limited to, externally attached components with multiple leads (FIG. 5). Moreover, the foregoing structures are not restricted to only inductor designs, but may also include transformers, other passive components, and active DFN and/or QFN power packages, as well as external components like heatsinks, RF shielding structures, and anything with leads formed for insertion into the mold compound vias to make electrical and thermal connections to the substrate pads. As shown in FIG. 5, the electronic device 1 includes a component 40 with eight (8) leads 42 (four of the leads 42 not shown). Other corresponding parts of the electronic device 1 in FIG. 5 may be the same or generally similar to those described herein with respect to FIGS. 1-4. Furthermore, the foregoing design is not limited to devices comprised of only one externally attached device but can also apply to packages with multiple attached components with a multitude of lead arrangements (e.g., side-to-side, end-to-end, end-over-end, etc.) (see FIG. 6). As shown in FIG. 6, the electronic device 1 includes two (2) components 40 each with four (4) leads 42 (two of the leads 42 of each component not shown). Other corresponding parts of the electronic device 1 in FIG. 6 may also be the same or generally similar to those described herein with respect to FIGS. 1-4.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An electronic device comprising:
   an integrated device package comprising a substrate and a package body over the substrate, and a hole formed through the package body to expose a conductive pad of the substrate;
   a component mounted over the package body, the component comprising a component body and a lead extending from the component body through the hole, the lead comprising a horizontal portion and a vertical portion extending non-parallel from the horizontal portion, the vertical portion of the lead including an insulated portion and a distal exposed portion, the insulated portion comprising a conductor and an insulating layer disposed about the conductor, the distal exposed portion being uncovered by the insulating layer such that the conductor is exposed at the distal portion, the distal exposed portion inserted at least partially into the hole formed through the package body; and
   a conductive material that electrically connects the distal exposed portion to the conductive pad of the substrate.

2. The electronic device of claim 1, wherein the distal exposed portion extends from a distal end of the lead to a terminal edge of the insulating layer, the terminal edge disposed at or above a bottom surface of the component body.

3. The electronic device of claim 2, wherein the terminal edge is disposed at a distance in a range of 0 mm to 1.2 mm above the bottom surface of the component body.

4. The electronic device of claim 2, wherein the insulating portion extends from the component body to the terminal edge.

5. The electronic device of claim 1, wherein the component comprises an inductor.

6. The electronic device of claim 5, wherein the inductor comprises a conductive material and a ferrite material in which the conductive material is encased, the insulating layer covering the conductive material embedded in the ferrite material.

7. The electronic device of claim 1, wherein the package body comprises a molding compound.

8. The electronic device of claim 7, wherein the integrated device package comprises one or a plurality of integrated device dies mounted to the substrate, the integrated device dies at least partially embedded in the molding compound.

9. The electronic device of claim 1, wherein the conductive material comprises solder.

10. The electronic device of claim 1, wherein a distal end of the lead is spaced above the conductive pad and does not contact the conductive pad.

11. An electronic component comprising:
    a component body, the component body comprising a conductive material and a ferrite material in which the conductive material is encased;
    a conductor comprising:
      a horizontal electrode portion extending continuously through the component body;
      a first lead extending downwardly along a first side of the component body from the horizontal electrode portion; and
      a second lead extending downwardly along a second side of the component body from the horizontal electrode portion; and
    an insulating layer disposed about the conductor along at least a portion of a length of the conductor.

12. The electronic component of claim 11, wherein the conductor does not include any coils or turns within the component body.

13. The electronic component of claim 11, wherein each of the first and second leads includes an insulated portion coated by the insulating layer and a distal exposed portion uncovered by the insulating layer such that the conductor is exposed at the distal portion.

14. The electronic component of claim 13, wherein the distal exposed portion extends from a distal end of each lead to a terminal edge of the insulating layer, the terminal edge disposed at or above a bottom surface of the component body.

15. The electronic device of claim 14, wherein the terminal edge is disposed at a distance in a range of 0 mm to 2 mm above the bottom surface of the component body.

16. The electronic component of claim 13, wherein the distal exposed portion is plated with a solderable material.

17. The electronic component of claim 11, wherein the insulating layer coats the horizontal electrode portion.

18. A method of forming an electronic device with a package structure, the method comprising:
    providing a substrate having a top surface;
    mounting a package body on the top surface of the substrate;
    forming a hole through the package body to expose a conductive pad of the substrate;
    mounting a component over the package body, wherein the component comprises a component body and a lead extending from the component body through the hole, the lead comprising a horizontal portion and a vertical portion extending non-parallel from the horizontal portion, and the vertical portion of the lead comprises an insulated portion and a distal exposed portion, the insulated portion comprising a conductor and an insulating layer disposed about the conductor, the distal exposed portion inserted at least partially into the hole formed through the package body; and
    electrically connecting the distal exposed portion to the conductive pad of the substrate via a conductive material.

19. The method of claim 18, further comprising uncovering the distal exposed portion such that the conductor is exposed at the distal portion, wherein uncovering the distal exposed portion comprises uncovering the distal exposed portion such that the distal exposed portion extends from a distal end of the lead to a terminal edge of the insulating layer, and the terminal edge is disposed at or above a bottom surface of the component body.

20. The method of claim 19, wherein uncovering the distal exposed portion comprises uncovering the distal exposed portion such that the terminal edge is disposed at a distance in a range of 0 mm to 2 mm above the bottom surface of the component body.

* * * * *

UNITED STATES PATENT AND TRADEMARK OFFICE
CERTIFICATE OF CORRECTION

| | | |
|---|---|---|
| PATENT NO. | : 11,844,178 B2 | |
| APPLICATION NO. | : 17/325080 | |
| DATED | : December 12, 2023 | |
| INVENTOR(S) | : John David Brazzle et al. | |

It is certified that error appears in the above-identified patent and that said Letters Patent is hereby corrected as shown below:

In the Claims

Column 10, Line 20, Claim 15, delete "device" and insert -- component --.

Signed and Sealed this
Twenty-seventh Day of February, 2024

Katherine Kelly Vidal
*Director of the United States Patent and Trademark Office*